United States Patent
Swanson et al.

(10) Patent No.: US 6,262,445 B1
(45) Date of Patent: Jul. 17, 2001

(54) SIC SIDEWALL PROCESS

(75) Inventors: Leland S. Swanson; Douglas A. Prinslow, both of McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/276,047

(22) Filed: Mar. 25, 1999

Related U.S. Application Data

(60) Provisional application No. 60/079,965, filed on Mar. 30, 1998.

(51) Int. Cl.[7] .................................................. H01L 29/76
(52) U.S. Cl. ............................................ 257/288; 257/900
(58) Field of Search ...................................... 257/410, 411, 257/613, 76–77, 900, 288

(56) References Cited

U.S. PATENT DOCUMENTS

| | | | | |
|---|---|---|---|---|
| 5,039,621 | * | 8/1991 | Pollack | 438/164 |
| 5,254,490 | * | 10/1993 | Kondo | 438/297 |
| 5,439,846 | | 8/1995 | Nguyen et al. | 437/187 |
| 5,739,066 | * | 4/1998 | Pan | 438/595 |
| 6,103,590 | * | 8/2000 | Swanson et al. | 438/409 |

* cited by examiner

Primary Examiner—Stephen D. Meier
Assistant Examiner—Jeff Vockrodt
(74) Attorney, Agent, or Firm—Jacqueline J. Garner; W. James Brady, III; Frederick J. Telecky, Jr.

(57) ABSTRACT

The use of silicon carbide to form sidewall spacers allows the use of a lower temperature deposition step, and provides greater etch selectivity with respect to oxide.

2 Claims, 1 Drawing Sheet

SIC SIDEWALL PROCESS

This application claims priority under 35 USC § 119 (e)(1) of provisional application No. 60/079,965, filed Mar. 30, 1998.

BACKGROUND AND SUMMARY OF THE INVENTION

The present invention relates to integrated circuit structures and fabrication methods.

Background: Sidewall Spacers

A technology which was first proposed in the 1970s is sidewall spacers on MOS gate structures. These sidewall spacers perform two important functions: they provide a lateral separation between the conductive gate material and conductive cladding (such as silicide) which may be present on the surface of the source/drain regions; and they also provide a useful alignment for the lightly doped drain regions. That is, a lighter dose of the source/drain dopant is preferably implanted before the sidewall spacers are in place, to form lightly-doped-drain (LDD) or medium-doped-drain (MDD) extension regions; a heavier dose is preferably implanted after the sidewall spacers are in place. This provides some self-aligned lateral separation between the most heavily doped parts of the source/drain diffusions and the corner of the gate.

During the 1990s, it has become increasingly common to fabricate such sidewall spacers using silicon nitride (Si3N4) rather than silicon dioxide. Silicon nitride has the advantage that a selective oxide etch, such as the source/drain contact etch, can stop on the nitride. Thus, it is no longer necessary to impose an offset rule between the contact location and the gate location (particularly if the top of the gate is also covered with silicon nitride). See, for example, U.S. Pat. No. 5,439,846, which is hereby incorporated by reference.

Conventionally the nitride sidewalls are deposited by a low-pressure chemical vapor deposition, or "LPCVD," process. However, this is a high-temperature process, typically performed at or above 700 degrees Centigrade, and this high temperature has become increasingly undesirable as this results in some degree of unwanted dopant diffusion. Also, since the nitride etch selectivity over SiO2 is low, a thicker oxide must be deposited over the gate to serve as an etch stop and prevent the etching of silicon.

Prior solutions to the dopant-diffusion problem have incorporated low-temperature Si3N4 depositions. However, the deposition rates of such processes are inherently low and prohibit their use in volume manufacturing.

Prior solutions to improving selectivity of Si3N4 to SiO2, in order to stop the sidewall etch before silicon is exposed, have concentrated on improvements in the etch process. To date, typical selectivities are in the 3–4 range.

Transistor and Process Structure with Silicon Carbide Sidewall Spacers

The present application describes a new process for fabricating transistors, using silicon carbide sidewall spacers. The use of silicon carbide has two distinct advantages over the conventional use of silicon nitride: first, good quality silicon carbide can be deposited at temperatures of 600 degrees C and below. Secondly, silicon carbide can be etched selectively to oxide. This is very convenient for forming the sidewall spacer, since the risk of erosion of the underlying thin oxide is reduced.

Advantages of the disclosed methods and structures include:

selectivity of etching SiC on SiO2 allows use of a thinner oxide to cap the gate, beneath the sidewall material, important for short channel length CMOS;

lower deposition temperature decreases lateral diffusion of dopants, especially for PMOS devices;

lower deposition temperature reduces base-width of vertical NPN's with boron of BF2 bases;

reduces emitter diffusion in vertical PNP's.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Process Embodiment: CMOS with PECVD Deposition of SiC

Figure 1:
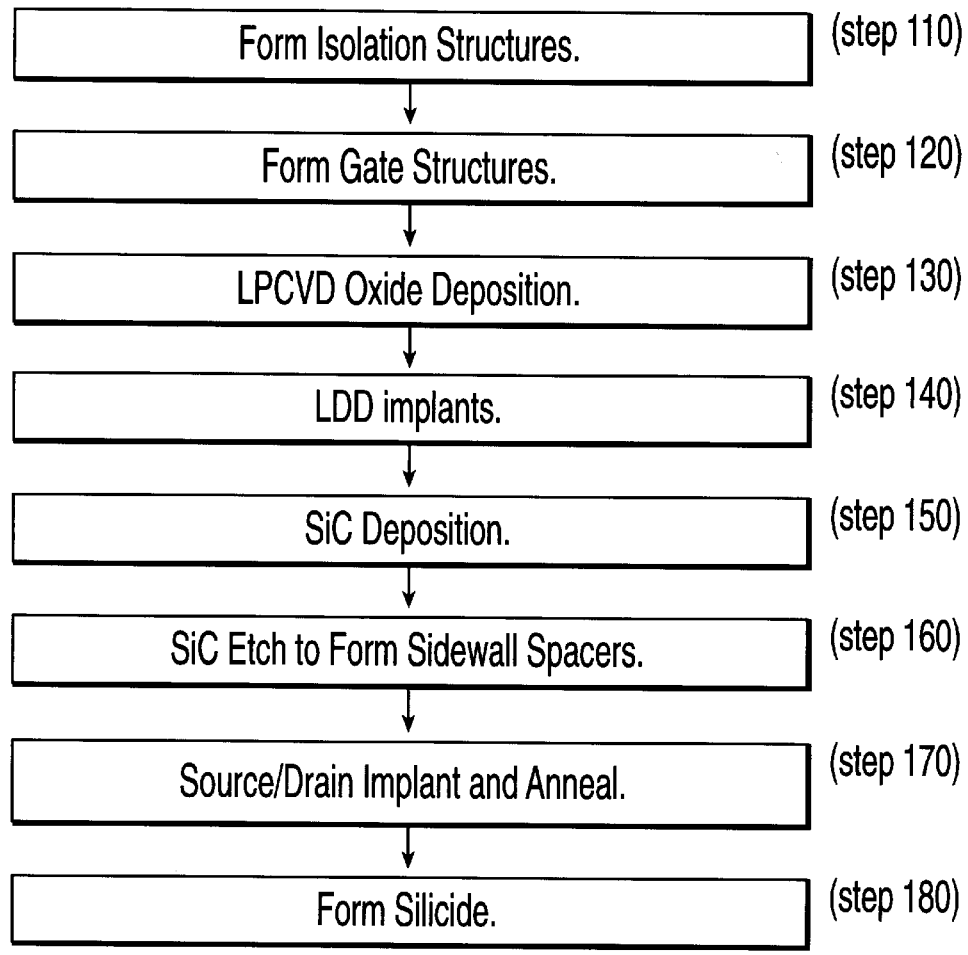
FIG. 1 shows a flowchart of a portion of the formation of CMOS devices, using the disclosed process.
Figure 2:
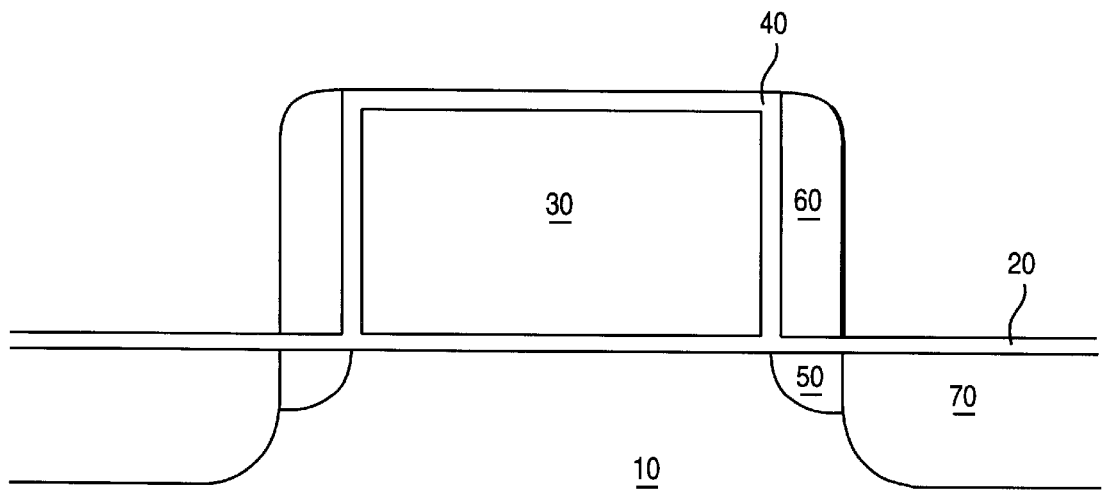
FIG. 2 shows a partially fabricated transistor structure, with the disclosed SiC gate sidewalls.

The flow for CMOS fabrication using the disclosed invention is shown in the flowchart of FIG. 1, which is discussed with reference to the cross-section of FIG. 2:

Processing of the wafer 10 begins with the formation (step 110) of isolation structures (not shown). These can include field oxide (FOX) isolation, or any of the newer isolations, such as shallow trench isolation (STI). This is followed by formation of a gate oxide 20, and deposition and patterning (step 120) of a layer of polysilicon to form gate structures 30 (e.g., 250 nm of polysilicon for a 0.18 micron geometry). A layer of an oxide 40, such as silicon oxide is then deposited (step 130), typically by low pressure chemical vapor deposition (LPCVD) to a thickness of 5–30 nm. The areas to receive N-type and P-type LDD implants 50 are successively patterned and implanted (step 140).

A layer of silicon carbide (SiC) is then deposited (step 150) by plasma enhanced chemical vapor deposition (PECVD) to a depth of 50– 150 nm using the following conditions:

| | |
|---|---|
| Source gas: | silane/methane, trimethylsilane, or other organosilicon gas |
| Carrier gas: | Ar or He |
| Total gas flow: | 500–2000 sccm |
| Pressure | 2-8 Torr |
| RF power density | approximately 2 W/cm2 (13.56 MHz) |
| Substrate temperature | 200–500 degrees C |

The SiC is selectively etched (step 160) with respect to the underlying oxide to form sidewall spacers 60. A ratio of removal rates of 10:1 have been achieved for SiC:SiO2, using the following conditions:

| | |
|---|---|
| Gases: | Ar, Cl2, O2 |
| Gas Flow | 50–200 sccm |
| Chamber pressure: | 50–500 mTorr |
| RF Power density | approximately 0.5–4 W/cm2 (13.56 MHz)] |
| Magnetic Field | 0–30 G |

Following formation of the sidewall spacers, the source/drain regions 70 are successively patterned and implanted with N-type and P-type dopants, followed by any necessary anneal (step 170). Silicide contacts (not shown) are formed on the top of the gate and the source/drain regions (step 180). Processing will continue with the standard CMOS process steps, such as deposition of dielectric and metallization layers.

Alternate Embodiment: LPCVD Deposition

In an alternate embodiment, low pressure CVD (LPCVD) is used to deposit the SiC in step 150.

| | |
|---|---|
| Source Gases: | silane/methane, trimethylsilane or other organosilicon gas |
| Gas Flow: | 10–100 sccm |
| Pressure: | 0.05–0.5 T |
| Temperature: | 600–850 degrees C |

According to a disclosed class of innovative embodiments, there is provided: A transistor gate structure, comprising: a sidewall spacer, predominantly comprising silicon carbide, which is self-aligned to vertical sidewalls of a patterned thin-film conductor.

According to another disclosed class of innovative embodiments, there is provided: A field effect transistor structure, comprising: a patterned conductive material, which is capacitively coupled to a semiconductor channel region through a gate dielectric; sidewall spacers predominantly comprising silicon carbide, which are self-aligned to sidewalls of said conductive material; source/drain diffusions in said semiconductor material, which are self-aligned to said sidewall spacers; and lightly-doped source/drain extension regions which are self-aligned to said sidewalls of said conductive material, and not to said sidewall spacers.

According to another disclosed class of innovative embodiments, there is provided: A method for fabricating integrated circuit devices, comprising the steps of: (a.) forming an insulated gate conductor which at least partly overlies, and is capacitively coupled to, a semiconductor active area having a first type of conductivity; (b.) implanting dopants of a second type of conductivity into said semiconductor to form lightly doped source/drain regions which are self-aligned to the edges of said insulated gate conductor; (c.) conformally depositing, and anisotropically etching back, a dielectric material predominantly comprising silicon carbide; said etching back step being continued long enough to clear said dielectric material from flat locations; (d.) implanting dopants of said second type of conductivity into said semiconductor, where not covered by said gate conductor nor by remaining portions of said dielectric material, to form source/drain diffusions; and (e.) connecting said gate conductor and said source/drain diffusions to implement an operative circuit configuration.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims. While the inventions have been described with reference to a single poly layer, it will be readily recognized that these inventions would normally be applied to processes with two, three, or more layers of polysilicon or polycide.

It should also be noted that the disclosed silicon carbide sidewall methods and processes are not by any means limited to pure polysilicon gate structures, but can be applied to polycide gate structures, metal/barrier/polysilicon gate structures, and also to metal/barrier structures which do not include any polysilicon, and also to silicon/germanium hybrid gate structures.

Although the primary embodiments have been described in terms of bulk silicon, the disclosed process can also be used with insulator (SOI) processes.

It will be recognized by those of ordinary skill in the art that hybrid compounds can be formed from combinations of compatible dielectrics. Since silicon nitride and silicon carbide have both been demonstrated to work, it is predicted that hybrids of these two compounds can also be used for sidewall spacers.

Similarly, since oxynitrides also have been demonstrated to be functional sidewall spacers, it is predicted that silicon carboxynitrides can also be used for sidewall spacers, although this is less preferred.

Since silicon dioxide spacers have also been demonstrated for sidewalls, it is also predicted that sidewall spacers having a composition which is a hybrid of silicon dioxide and silicon carbide can be used, although this is less preferred.

Although the primary embodiments have been described in terms of CMOS processing, this is applicable to other processes which use a Si3N4 sidewall spacer, such as RF-BiCMOS, BCD and BCE technologies.

What is claimed is:

1. A field effect transistor structure, comprising:

a patterned conductive material, which is capacitively coupled to a semiconductor channel region through a gate dielectric;

sidewall spacers predominantly comprising silicon carbide, which are self-aligned to sidewalls of said conductive material;

source/drain diffusions in said semiconductor material, which are self-aligned to said sidewall spacers; and lightly-doped source/drain extension regions which are self-aligned to said sidewalls of said conductive material, and not to said sidewall spacers.

2. The structure of claim 1, further comprising:

a cap oxide layer disposed between the patterned conductive material and the sidewall spacers.

* * * * *